(12) United States Patent
Mitamura (10) Patent No.: US 10,355,083 B2
(45) Date of Patent: Jul. 16, 2019

(54) SEMICONDUCTOR DEVICE

(71) Applicant: FUJI ELECTRIC CO., LTD., Kanagawa (JP)

(72) Inventor: Naoki Mitamura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/823,614

(22) Filed: Nov. 28, 2017

(65) Prior Publication Data

US 2018/0204910 A1     Jul. 19, 2018

(30) Foreign Application Priority Data

Jan. 17, 2017    (JP) ................... 2017-006254

(51) Int. Cl.
| | |
|---|---|
| *H01L 23/48* | (2006.01) |
| *H01L 29/40* | (2006.01) |
| *H01L 29/66* | (2006.01) |
| *H01L 29/10* | (2006.01) |
| *H01L 29/739* | (2006.01) |
| *H01L 29/423* | (2006.01) |
| *H01L 29/06* | (2006.01) |

(52) U.S. Cl.
CPC ......... *H01L 29/0696* (2013.01); *H01L 23/48* (2013.01); *H01L 29/1095* (2013.01); *H01L 29/407* (2013.01); *H01L 29/4238* (2013.01); *H01L 29/66348* (2013.01); *H01L 29/7396* (2013.01); *H01L 29/7397* (2013.01)

(58) Field of Classification Search
CPC ............. H01L 29/7397; H01L 27/0652; H01L 29/0696
See application file for complete search history.

(56) References Cited

U.S. PATENT DOCUMENTS

| | | | |
|---|---|---|---|
| 2006/0087343 | A1 | 4/2006 | Himi et al. |
| 2006/0163649 | A1 | 7/2006 | Otsuki |
| | | | (Continued) |

FOREIGN PATENT DOCUMENTS

| | | |
|---|---|---|
| JP | 2001-168333 A | 6/2001 |
| JP | 2006-148058 A | 6/2006 |
| | (Continued) | |

*Primary Examiner* — Charles D Garber
*Assistant Examiner* — Alia Sabur (57) ABSTRACT

A semiconductor device includes a semiconductor substrate having a drift region of a first conductivity type; a base region of a second conductivity type in the semiconductor substrate; an emitter region of the first conductivity type in the semiconductor substrate; a first gate trench portion that is formed in the upper surface of the semiconductor substrate and is in contact with the emitter region and the base region; a second gate trench portion formed in the upper surface of the semiconductor substrate; a first electrical element electrically connected to the first gate trench portion; and a second electrical element electrically connected to the second gate trench portion, wherein a time constant of an RC circuit constituted by the second electrical element and the second gate trench portion is greater than a time constant of an RC circuit constituted by the first electrical element and the first gate trench portion.

9 Claims, 10 Drawing Sheets

(56) References Cited

U.S. PATENT DOCUMENTS

| | | | |
|---|---|---|---|
| 2009/0096081 A1* | 4/2009 | Soyano | H01L 25/162 |
| | | | 257/698 |
| 2013/0001638 A1 | 1/2013 | Yoshikawa | |
| 2015/0129927 A1* | 5/2015 | Sumitomo | H01L 29/4236 |
| | | | 257/139 |
| 2018/0076309 A1* | 3/2018 | Philippou | H01L 29/0692 |

FOREIGN PATENT DOCUMENTS

| | | |
|---|---|---|
| JP | 2006-210547 A | 8/2006 |
| WO | 2012/073609 A1 | 6/2012 |

\* cited by examiner

SEMICONDUCTOR DEVICE

The contents of the following Japanese patent application(s) are incorporated herein by reference:
NO. 2017-006254 filed on Jan. 17, 2017.

BACKGROUND

1. Technical Field

The present invention relates to a semiconductor device.

2. Related Art

Conventionally, a semiconductor device is known that includes a semiconductor element such as an insulated gate type bipolar transistor (IGBT) and the like (for example, see Patent Document 1).
Patent Document 1: Japanese Patent Application Publication No. 2006-210547

A semiconductor device preferably has a predetermined capability with respect to a particular characteristic such as turn-on loss (Eon).

SUMMARY

An aspect of the present invention provides a semiconductor device. The semiconductor device may include a semiconductor substrate having a drift region of a first conductivity type. The semiconductor device may include a base region of a second conductivity type formed between an upper surface of the semiconductor substrate and the drift region in the semiconductor substrate. The semiconductor device may include an emitter region of the first conductivity type provided between the upper surface of the semiconductor substrate and the base region in the semiconductor substrate. The semiconductor device may include a first gate trench portion that is formed in the upper surface of the semiconductor substrate and is in contact with the emitter region and the base region. The semiconductor device may include a second gate trench portion formed in the upper surface of the semiconductor substrate. The semiconductor device may include a first electrical element electrically connected to the first gate trench portion. The semiconductor device may include a second electrical element electrically connected to the second gate trench portion. In the semiconductor device, a time constant of an RC circuit constituted by the second electrical element and the second gate trench portion may be greater than a time constant of an RC circuit constituted by the first electrical element and the first gate trench portion.

On the upper surface of the semiconductor substrate, an area of the emitter region provided in contact with the first gate trench portion may be larger than an area of the emitter region provided in contact with the second gate trench portion. The second gate trench portion may not be in contact with the emitter region.

The first electrical element may have a first resistor. The second electrical element may have a second resistor, a resistance value of which is greater than that of the first resistor.

The semiconductor device may include a gate pad formed above the semiconductor substrate. The semiconductor device may include a first electrical path that is formed above the semiconductor substrate and electrically connects the gate pad and the first gate trench portion. The semiconductor device may include a second electrical path that is formed above the semiconductor substrate and electrically connects the gate pad and the second gate trench portion. The first electrical element may be provided in the first electrical path. The second electrical element may be provided in the second electrical path.

The semiconductor device may include a package portion accommodating the semiconductor substrate. The semiconductor device may include a wiring substrate that is accommodated in the package portion and provided with wiring electrically connecting the first gate trench portion and the second gate trench portion. The first electrical element and the second electrical element may be provided in the wiring substrate.

The summary clause does not necessarily describe all necessary features of the embodiments of the present invention. The present invention may also be a sub-combination of the features described above.

BRIEF DESCRIPTION OF THE DRAWINGS

FIG. 6 is a graph showing an exemplary waveform of collector current Ic1 observed when the semiconductor device 100 is turned on.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

One side in a direction parallel to the depth direction of a semiconductor substrate is herein referred to as an 'upper' side, and the other side is referred to as an 'lower' side. Of two principal surfaces of a substrate, a layer, or some other members, one of the principal surfaces is referred to as the upper surface, and the other surface is referred to as the lower surface. 'Upward' and 'downward' directions do not necessarily refer to the gravity direction or the direction in which a semiconductor device is implemented.

Orthogonal coordinate axes of X-axis, Y-axis, and Z-axis are herein appropriately used to explain technical matters. The orthogonal coordinate axes are only for specifying relative positions of components and do not limit particular directions. For example, the Z-axis shows the height direction with respect to the ground but is not limited to that direction. Z-axis direction herein refers to an upward or downward direction.

Terms 'emitter' and 'collector' are herein used. However, an element included in a semiconductor device is not limited to a transistor such as an IGBT. Terms 'source' and 'drain' in a transistor such as a MOSFET may also be within the scope of the terms 'emitter' and 'collector' herein.

Each example shows a first conductivity type as N-type and second conductivity type as P-type. However, the first conductivity type may be P-type, and the second conductivity type may be N-type. In this case, conductivity types of a substrate, a layer, a region, and the like in each example respectively have opposite polarities.

Figure 1:
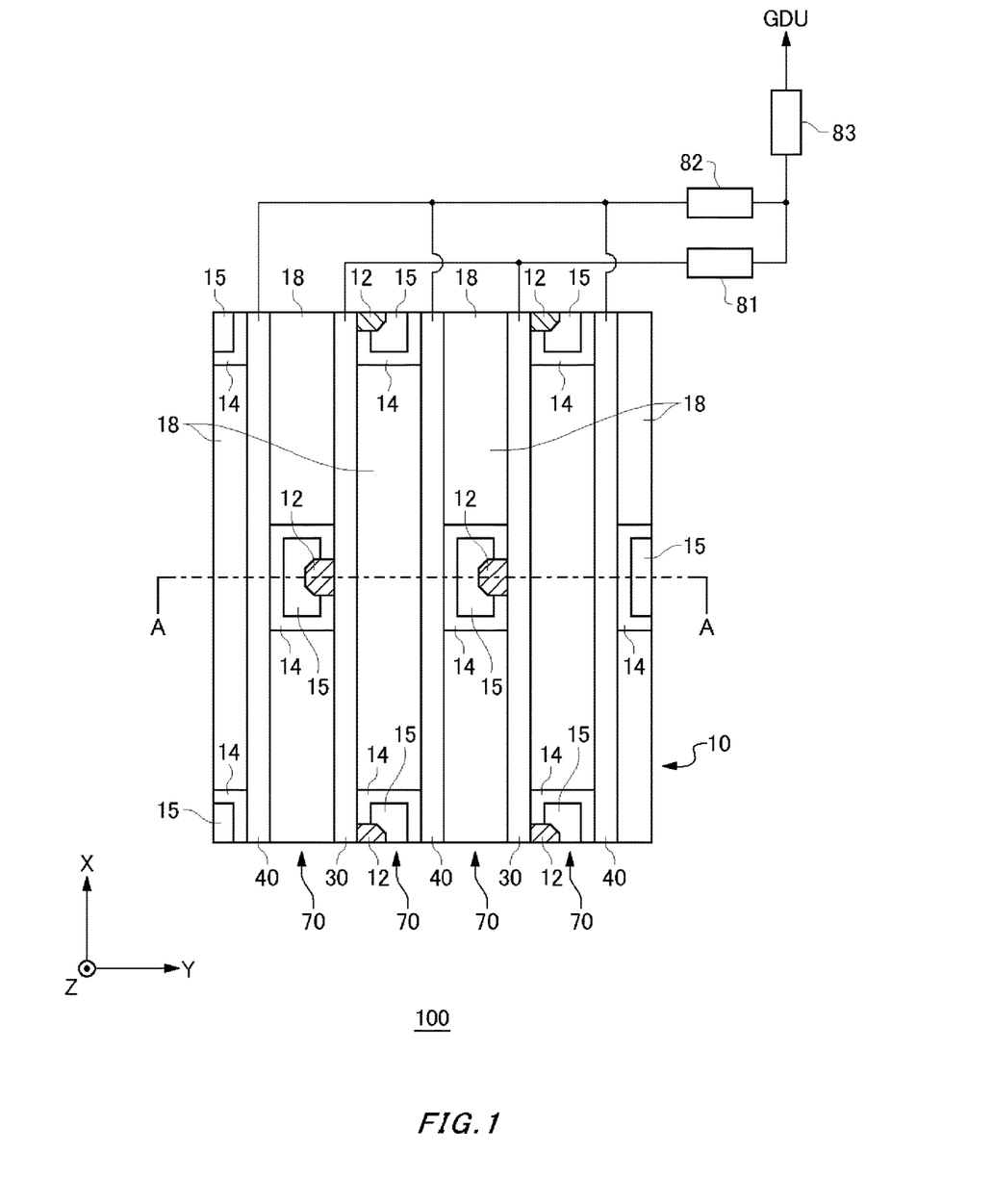
FIG. 1 is a diagram showing an exemplary semiconductor device 100 according to an embodiment of the present invention.

FIG. 1 is a diagram showing an exemplary semiconductor device 100 according to an embodiment of the present invention. The semiconductor device 100 includes a semiconductor substrate 10, a first electrical element 81, and a second electrical element 82. The semiconductor device 100 may also further include a third electrical element 83. The semiconductor substrate 10 is a substrate formed of semiconductor material such as silicon, silicon carbide, or gallium nitride.

A semiconductor element such as an IGBT is formed in the semiconductor substrate 10. FIG. 1 schematically shows part of an upper surface of the semiconductor substrate 10, the first electrical element 81, the second electrical element 82, and the third electrical element 83. The upper surface of the semiconductor substrate 10 refers to one of two principal surfaces provided to face each other in the semiconductor substrate 10. The upper surface of the semiconductor substrate 10 is herein a plane parallel to the X-Y plane.

FIG. 1 partially shows an active region in which a semiconductor element is formed in the semiconductor substrate 10, but the semiconductor substrate 10 may surround the active region and have an edge termination portion. The active region refers to a region in which current flows when the semiconductor device 100 is operated, for example. The edge termination portion mitigates electric field concentration in the vicinity of the upper surface of the semiconductor substrate. The edge termination portion has, for example, a guard ring, a field plate, a RESURF (reduced surface field), and a structure of combination thereof.

The semiconductor substrate 10 has a drift region 18 of a first conductivity type. The drift region 18 shown in FIG. 1 has a portion thereof exposed on the upper surface of the semiconductor substrate 10. However, the drift region 18 may not be exposed on the upper surface of the semiconductor substrate 10.

A first gate trench portion 30 and a second gate trench portion 40 are formed in the upper surface of the semiconductor substrate 10. The first gate trench portion 30 and the second gate trench portion 40 each have a groove shape formed from the upper surface of the semiconductor substrate 10 to the inside of the semiconductor substrate 10. The first gate trench portion 30 and the second gate trench portion 40 of the present example each have a linear portion extending in X-axis direction in the upper surface of the semiconductor substrate 10. In the upper surface of the semiconductor substrate 10, one or more linear portions of the first gate trench portions 30 and one or more linear portions of the second gate trench portions 40 are alternately arranged in Y-axis direction. In the example of FIG. 1, the linear portions of the first gate trench portions 30 and linear portions of the second gate trench portions 40 are alternately arranged one by one.

A region of the semiconductor substrate 10, the region sandwiched between the respective trench portions, is herein referred to as a mesa portion 70. In the example of FIG. 1, the drift region 18 is exposed on the upper surface of the semiconductor substrate 10 in each mesa portion 70. In each mesa portion 70, a base region 14 of the second conductivity type and an emitter region 12 of the first conductivity type are formed.

In the example of FIG. 1, the base region 14 and the emitter region 12 are discretely arranged in X-axis direction in each mesa portion 70. In the present example, the drift region 18 is exposed on part of the upper surface of the mesa portion 70, the part on which the base region 14 and the emitter region 12 are not exposed. In the mesa portions 70 adjacent to each other in Y-axis direction, positions on the X-axis at which the base regions 14 and the emitter regions 12 are provided may be different. For example, the position on X-axis at which one of the base regions 14 is provided in one of the mesa portions 70 corresponds to the middle between the positions on the X-axis at which two of the base regions 14 are respectively provided in the adjacent mesa portion 70. The intervals of the base regions 14 provided in each mesa portion 70 may be the same in X-axis direction.

The base region 14 is exposed on the upper surface of the semiconductor substrate 10 in the mesa portion 70. The base region 14 is also provided in contact with the first gate trench portion 30. The base region 14 may also be in contact with the second gate trench portion 40.

The emitter region 12 is exposed on the upper surface of the semiconductor substrate 10 in the mesa portion 70. The emitter region 12 is provided in contact with the first gate trench portion 30. The emitter region 12 of the present example is not in contact with the second gate trench portion 40. The emitter region 12 of the present example is surrounded by the base region 14 and the first gate trench portion 30 in the upper surface of the semiconductor substrate 10.

On the upper surface of the semiconductor substrate 10, an interlayer insulating film is formed to cover the first gate trench portion 30, the second gate trench portion 40, the emitter region 12, the base region 14, and the drift region 18. On the interlayer insulating film, a gate electrode and an emitter electrode are provided. The emitter electrode is electrically connected to the emitter region 12 and the base region 14 via a contact hole 15 provided in the interlayer insulating film. Similarly, the gate electrode may be electrically connected to the respective gate trench portions via the contact hole provided in the interlayer insulating film.

Figure 2:
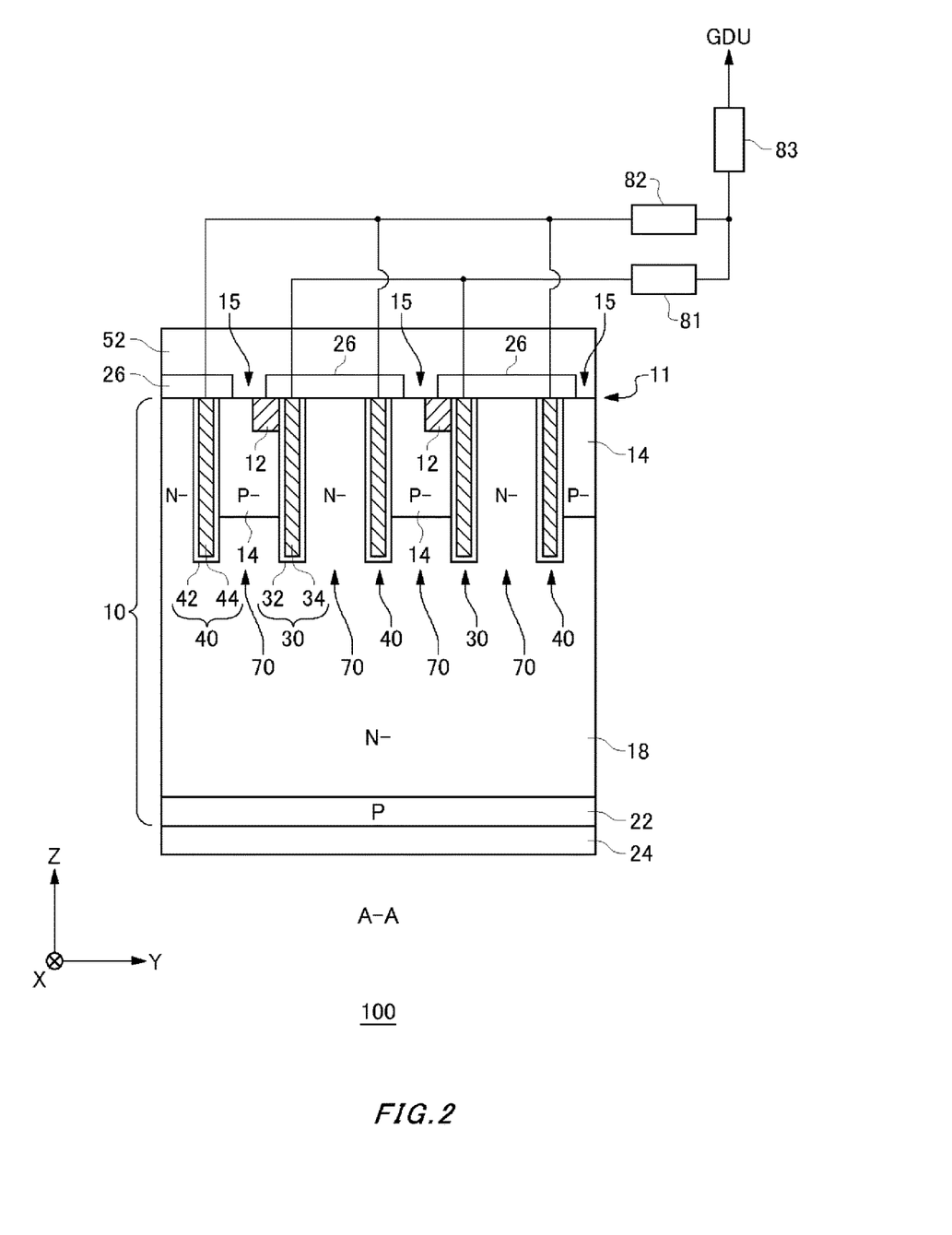
FIG. 2 is a diagram showing an exemplary cross section taken along A-A in FIG. 1.

FIG. 2 is a diagram showing an exemplary cross section taken along A-A in FIG. 1. The cross section taken along A-A is parallel to Y-Z plane and is a plane passing through any one of the emitter regions 12. The semiconductor substrate 10 of the present example has the drift region 18 of $N^-$-type.

In the semiconductor substrate 10, the base region 14 of $P^-$-type is formed between an upper surface 11 of the semiconductor substrate 10 and the drift region 18. As described above, the base region 14 may be selectively formed in the mesa portion 70. In a region in which the base region 14 is not formed, the drift region 18 is exposed on the upper surface 11 of the semiconductor substrate 10. At the cross section, the mesa portion 70 in which the base region 14 is exposed on the upper surface and the mesa portion 70 in which the drift region 18 is exposed on the upper surface are alternately arranged.

In the semiconductor substrate 10, the emitter region 12 of $N^+$-type is formed between the upper surface 11 of the semiconductor substrate 10 and the base region 14. The impurity concentration in the emitter region 12 is higher than the impurity concentration in the drift region 18. In the mesa portion 70 in which the base region 14 is provided, the emitter region 12 is in contact with the first gate trench portion 30 and is not in contact with the second gate trench portion 40.

An interlayer insulating film 26 is formed on the upper surface of the semiconductor substrate 10. The interlayer insulating film 26 is a silicate glass doped with at least one of boron and phosphorus, for example. The contact hole 15 is provided in the interlayer insulating film 26, and through the contact hole 15, each base region 14 and emitter region 12 are exposed.

On the interlayer insulating film 26, an emitter electrode 52 is formed. The emitter electrode 52 is also filled into the inside of the contact hole 15. The emitter electrode 52 is thereby electrically connected to the emitter region 12 and the base region 14. Note that the drift region 18 is covered with the interlayer insulating film 26 and is not electrically connected to the emitter electrode 52.

The emitter electrode 52 is formed of material containing metal. For example, at least a partial region of the emitter electrode 52 is formed of aluminum or aluminum-silicon alloy. The emitter electrode 52 may have a barrier metal formed of titanium, titanium compound, or the like in a layer beneath the region formed of aluminum or the like, and may also have a plug formed of tungsten or the like in the contact hole 15.

On the lower surface side of the semiconductor substrate 10, a collector region 22 of P-type is formed between the drift region 18 and the lower surface of the semiconductor substrate 10. If the collector region 22 is formed, the semiconductor device 100 operates as an IGBT. On the lower surface of the semiconductor substrate 10, a collector electrode 24 is formed. The collector electrode 24 is formed of material containing metal. For example, at least a partial region of the collector electrode 24 is formed of aluminum or aluminum-silicon alloy.

The first gate trench portion 30 is formed from the upper surface of the semiconductor substrate 10 to a position deeper than the lower end of the base region 14. A side wall of the first gate trench portion 30 is in contact with the emitter region 12 and the base region 14.

The first gate trench portion 30 has a gate insulating film 32 formed to cover the inner wall of the trench, and a gate conductive portion 34 surrounded by the gate insulating film 32. The gate insulating film 32 insulates the gate conductive portion 34 from the semiconductor substrate 10. The gate insulating film 32 is, for example, an oxidized film formed by oxidizing the inner wall of the trench or a nitride film formed by nitriding the inner wall of the trench. The gate conductive portion 34 is formed of, for example, polysilicon doped with impurities.

The gate conductive portion 34 includes a region facing at least the base region 14 in Z-axis direction. With a predetermined gate voltage applied to the gate conductive portion 34, a channel is formed in an interfacing surface layer of the base region 14, the interfacing surface layer in contact with the first gate trench portion 30.

The second gate trench portion 40 is formed from the upper surface of the semiconductor substrate 10 to a predetermined depth position. The second gate trench portion 40 may have the same structure, material and size as those of the first gate trench portion 30. The second gate trench portion 40 has a gate insulating film 42 formed to cover the inner wall of the trench and a gate conductive portion 44 surrounded by the gate insulating film 42.

The first electrical element 81 is electrically connected to the gate conductive portion 34 of the first gate trench portion 30. The first electrical element 81 is provided in an electrical path through which gate voltage is applied to the gate conductive portion 34. The second electrical element 82 is electrically connected to the gate conductive portion 44 of the second gate trench portion 40. The second electrical element 82 is provided in an electrical path through which gate voltage is applied to the gate conductive portion 44. The first electrical element 81 and the second electrical element 82 may be provided on the semiconductor substrate 10 or on a substrate different from the semiconductor substrate 10.

The semiconductor device 100 of the present example has the third electrical element 83 provided to be shared by the first electrical element 81 and the second electrical element 82. The third electrical element 83 may be a resistor electrically connected to an external gate driver unit (GDU). The gate driver unit applies voltage and current to each gate trench portion via the first electrical element 81, the second electrical element 82, and the third electrical element 83.

The first electrical element 81 and the first gate trench portion 30 constitute an RC circuit to have a predetermined time constant. The second electrical element 82 and the second gate trench portion 40 constitute an RC circuit to have a predetermined time constant. For example, the first electrical element 81 and the second electrical element 82 each include at least one of a resistor and a capacitor. The time constant of the RC circuit constituted by the second electrical element 82 and the second gate trench portion 40 is greater than the time constant of the RC circuit constituted by the first electrical element 81 and the first gate trench portion 40. The characteristic of the semiconductor device 100 can thereby be adjusted.

An assumed example is a circuit in which a switching element such as an IGBT and an element such as a free wheel diode (FWD) are provided in parallel. The circuit is used in a power conversion circuit and the like. If the circuit performs switching operation, EMC noise is generated in some cases. In particular, as the voltage change dVak/dt over time between the anode and cathode of the FWD increases, the EMC noise increases. For this reason, when the EMC noise is desired to be lowered, dVak/dt is preferably lowered. The value of dVak/dt of the FWD can be lowered by increasing gate resistance Rg of the switching element in an arm facing the power conversion circuit.

On the other hand, if the gate resistance Rg of the switching element is increased, turn-on loss (Eon) of the switching element increases. That is, dVak/dt and Eon are in a trade-off relationship when adjusted by the gate resistance Rg.

When the IGBT is turned on, holes are generally injected from the collector side into the drift region to modulate the conductivity, so that the ON voltage can be lowered. Some of the holes are accumulated in the side wall of the gate trench portion. When the holes are accumulated in the vicinity of the side wall of the gate trench portion, a gate-emitter voltage Vge increases, so that collector current Ic rapidly increases when the semiconductor device 100 is turned on. If the collector current Ic rapidly increases, dVak/dt of the FWD increases.

In the semiconductor device 100, the first gate trench portion 30 in contact with the emitter region 12 is connected to the first electrical element 81, with which the time constant of the RC circuit can relatively be lowered, and the second gate trench portion 40 not in contact with the emitter region 12 is connected to the second electrical element 82, with which the time constant of the RC circuit can relatively be increased. For example, the first electrical element 81 has a first resistor, and the second electrical element 82 has a second resistor, the resistance value of which is greater than that of the first resistor. Furthermore, the trench capacitance of the first gate trench portion 30 is substantially the same as the trench capacitance of the second gate trench portion 40. The resistance value of the second resistor may be equal to or greater than ten times or equal to or greater than twenty times the resistance value of the first resistor.

Because of the difference between the time constants of the RC circuits, the potential of the gate conductive portion 44 of the second gate trench portion 40 increases more gradually than the potential of the gate conductive portion 34 of the first gate trench portion 30 when the semiconductor device 100 is turned on. As a result, more holes are accumulated in the vicinity of the side wall of the second gate trench portion 40 than in that of the first gate trench portion 30. However, the emitter region 12 is not in contact with the second gate trench portion 40, so that collector current Ic is not influenced even if the Vge of the second gate trench portion 40 increases.

Thus, the semiconductor device 100 can generate electron injection enhancement effect (IE effect) by accumulating holes to lower the turn-on loss and suppress steep fluctuation of collector current Ic. The trade-off between dVak/dt and Eon can thereby be improved. Note that the IE effect can be enhanced more with the second gate trench portion 40 than with a dummy trench to which an emitter potential is applied. For example, using the second gate trench portion 40 of the gate potential can decrease the holes with positive charge passing through the gate insulating film 42 and entering into the gate conductive portion 44 in the trench.

Figure 3:
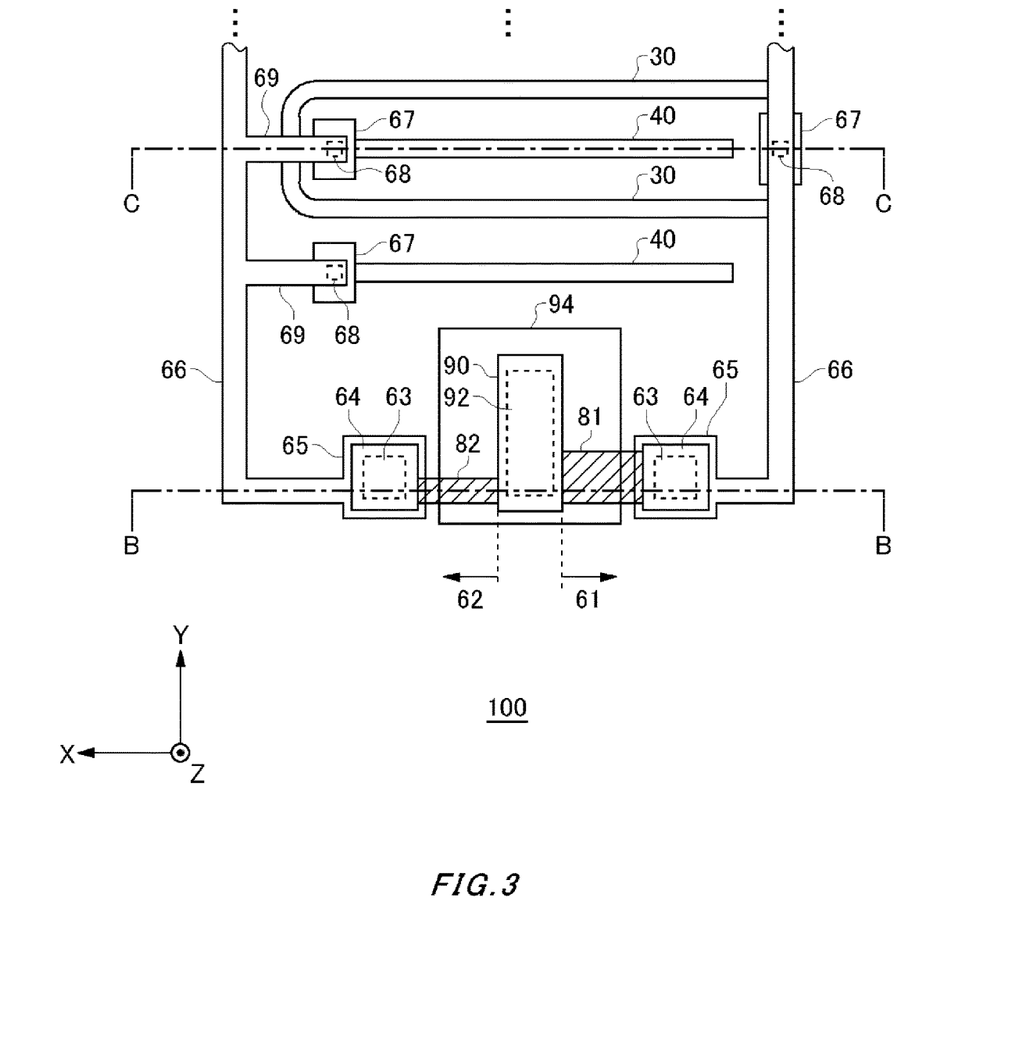
FIG. 3 is a top view showing exemplary first electrical element 81 and second electrical element 82.
Figure 4:
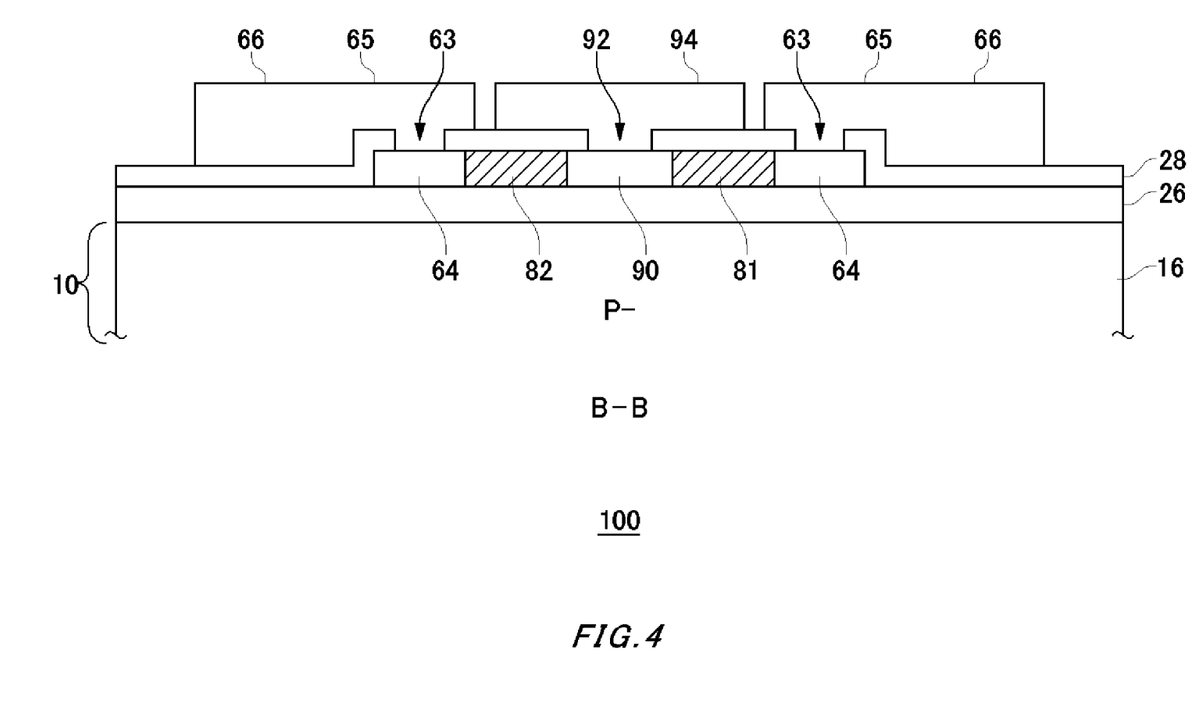
FIG. 4 shows an exemplary cross section taken along B-B in FIG. 3.
Figure 5:
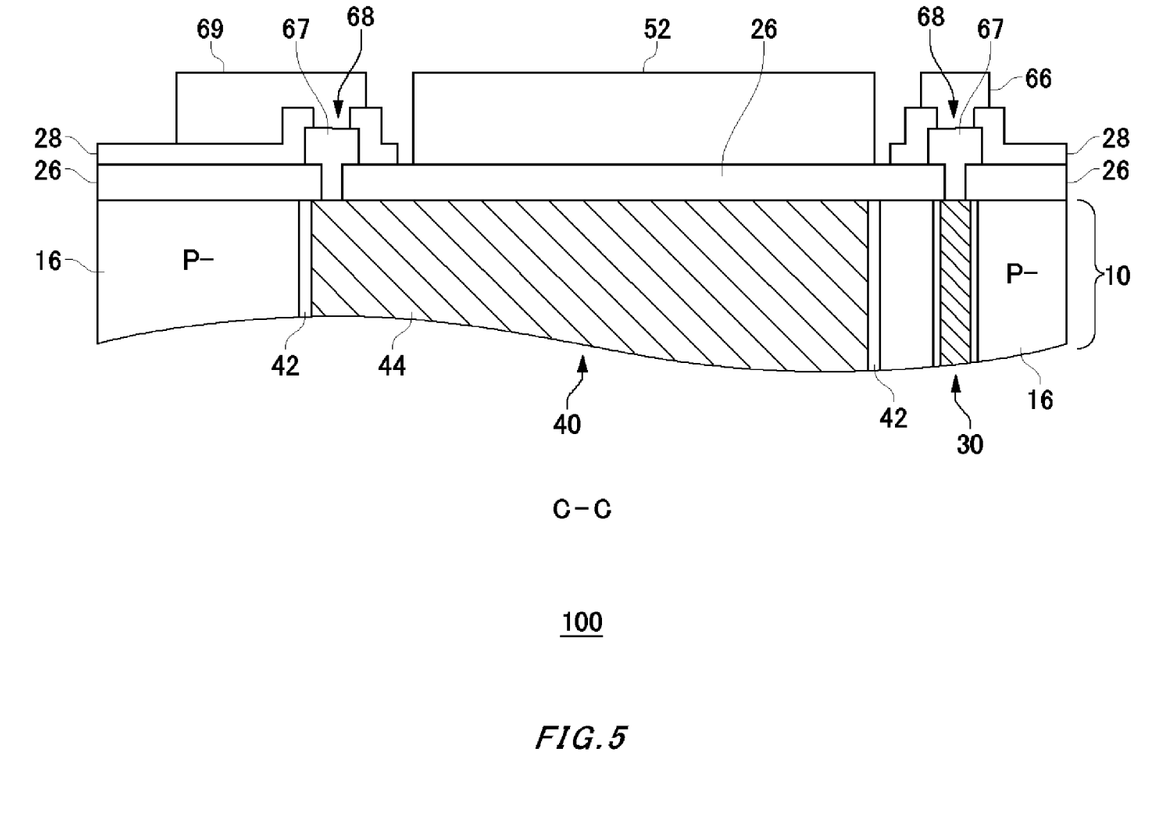
FIG. 5 shows an exemplary cross section taken along C-C in FIG. 3.

FIG. 3 is a top view showing the exemplary first electrical element 81 and second electrical element 82. FIG. 4 shows an exemplary cross section taken along B-B in FIG. 3, and FIG. 5 shows an exemplary cross section taken along C-C in FIG. 3. FIG. 3 shows an exemplary arrangement of the respective members in or on the upper surface of the semiconductor substrate 10. The first electrical element 81 and the second electrical element 82 of the present example are formed above the upper surface 11 of the semiconductor substrate 10.

The semiconductor device 100 of the present example has a gate pad 94, a first electrical path 61, and a second electrical path 62 above the semiconductor substrate 10. The gate pad 94 is formed of metal containing aluminum and the like, and gate voltage is applied thereto. The gate pad 94 may be connected to an external gate driver unit with wiring including wire and the like.

The gate pad 94, the first electrical path 61, and the second electrical path 62 are insulated from the semiconductor substrate 10 by the interlayer insulating film 26 and the like. Beneath the gate pad 94, a connection portion 90 may be arranged. The connection portion 90 of the present example is formed of polysilicon doped with impurities. An insulating film 28 is provided between the gate pad 94 and the connection portion 90. A contact hole 92 is formed in the insulating film, and the gate pad 94 is formed also inside the contact hole 92. The gate pad 94 and the connection portion 90 are thereby electrically connected.

The first electrical path 61 electrically connects the gate pad 94 and the gate conductive portion 34 of the first gate trench portion 30. The first electrical path 61 has the first electrical element 81, a connection portion 64, a metal wiring 66, and a connection portion 67. The first electrical element 81 of the present example is formed of polysilicon doped with impurities. The interlayer insulating film 26 may be provided between the first electrical element 81 and the upper surface 11 of the semiconductor substrate 10. One end of the first electrical element 81 is connected to the connection portion 90.

The other end of the first electrical element 81 is connected to the connection portion 64. The connection portion 64 of the present example is formed of polysilicon doped with impurities. An end of the metal wiring 66 is provided above the connection portion 64. The metal wiring 66 may have a pad portion 65 at the end thereof, the pad portion 65 having a width larger than that of any other region of the metal wiring 66. The pad portion 65 is arranged above the connection portion 64.

The insulating film 28 is provided between the connection portion 64 and the pad portion 65. A contact hole 63 is formed in the insulating film 28, and the pad portion 65 is formed also inside the contact hole 63. The connection portion 64 and the pad portion 65 are thereby electrically connected.

The metal wiring 66 is formed from the connection portion 64 to and above the first gate trench portion 30. In the present example, a plurality of first gate trench portions 30 are arrayed in Y-axis direction. Each first gate trench portion 30 may be annularly provided in the upper surface of the semiconductor substrate 10. For example, the metal wiring 66 is provided to extend in Y-axis direction and connected to the plurality of first gate trench portions 30.

The connection portion 67 is provided between each first gate trench portion 30 and the metal wiring 66. The connection portion 67 of the present example is formed of polysilicon doped with impurities. The connection portion 67 is connected to the gate conductive portion 34 of the first gate trench portion 30 via the contact hole provided in the interlayer insulating film 26. The insulating film 28 is provided between the connection portion 67 and the metal wiring 66. A contact hole 68 is formed in the insulating film 28, and the metal wiring 66 is formed also inside the contact hole 68. The connection portion 67 and the metal wiring 66 are thereby electrically connected.

The second electrical path 62 electrically connects the gate pad 94 and the gate conductive portion 44 of the second gate trench portion 40. The second electrical path 62 has the second electrical element 82, the connection portion 64, the metal wiring 66, and the connection portion 67. The second electrical element 82 of the present example is formed of polysilicon doped with impurities. The interlayer insulating film 26 may be provided between the second electrical element 82 and the upper surface 11 of the semiconductor substrate 10. An end of the second electrical element 82 is connected to the connection portion 90.

The resistance value of the second electrical element 82 is greater than that of the first electrical element 81. In the present example, in Y-Z plane perpendicular to a straight line connecting the connection portion 90 and the connection portion 64, the cross-sectional area of the second electrical element 82 is smaller than that of the first electrical element 81. That is, at least one of the width in Y-axis direction and the thickness in Z-axis direction of the second electrical element 82 is smaller than that of the first electrical element 81.

The structures of the connection portion 64, the metal wiring 66, and the connection portion 67 in the second electrical path 62 are the same as those of the connection portion 64, the metal wiring 66, and the connection portion 67 in the first electrical path 61. However, the connection portion 67 is provided above each second gate trench portion 40. The second gate trench portion 40 may have a linear shape in the upper surface of the semiconductor substrate 10.

The other end of the second electrical element 82 is connected to the connection portion 64. An end of the metal wiring 66 is provided above the connection portion 64. The metal wiring 66 may have the pad portion 65 at the end thereof, the pad portion 65 having a width larger than that of any other region of the metal wiring 66. The pad portion 65 is arranged above the connection portion 64.

The insulating film 28 is provided between the connection portion 64 and the pad portion 65. The contact hole 63 is formed in the insulating film 28, and the pad portion 65 is formed also inside the contact hole 63. The connection portion 64 and the pad portion 65 are thereby electrically connected.

The metal wiring 66 is formed from the connection portion 64 to and above the second gate trench portion 40. In the present example, a plurality of second gate trench portions 40 are arrayed in Y-axis direction. For example, the metal wiring 66 is provided to extend in Y-axis direction and is connected to the plurality of second gate trench portions 40.

The connection portion 67 is provided between each second gate trench portion 40 and the metal wiring 66. The connection portion 67 is connected to the gate conductive portion 44 of the second gate trench portion 40 via the contact hole provided in the interlayer insulating film 26. The insulating film 28 is provided between the connection portion 67 and the metal wiring 66. The contact hole 68 is formed in the insulating film 28, and the metal wiring 66 is formed also inside the contact hole 68. The connection portion 67 and the metal wiring 66 are thereby electrically connected.

In the semiconductor substrate 10, a well region 16 of the second conductivity type is provided to surround an end of each gate trench portion in X-axis direction. This can mitigate electric field concentration at the end of each gate trench portion. The well region 16 may also be formed beneath the gate pad 94, the first electrical path 61, and the second electrical path 62.

Note that the metal wiring 66 of the first electrical path 61 may be provided above the first gate trench portion 30 as shown in FIG. 3. On the other hand, the metal wiring 66 of the second electrical path 62 may not be provided above the second gate trench portion 40. In this case, the second electrical path 62 has a branch wiring 69 branching off and provided from the metal wiring 66 to and above the second gate trench portion 40. The branch wiring 69 may be formed of the same material as that of the metal wiring 66.

Such an arrangement can easily insulate the second electrical path 62 from the first gate trench portion 30. The path length of the second electrical path 62 becomes longer by providing the branch wiring 69, so that the resistance value increases. However, because the path is connected to the second gate trench portion 40, the increase of the resistance value does not cause problems.

Figure 6:
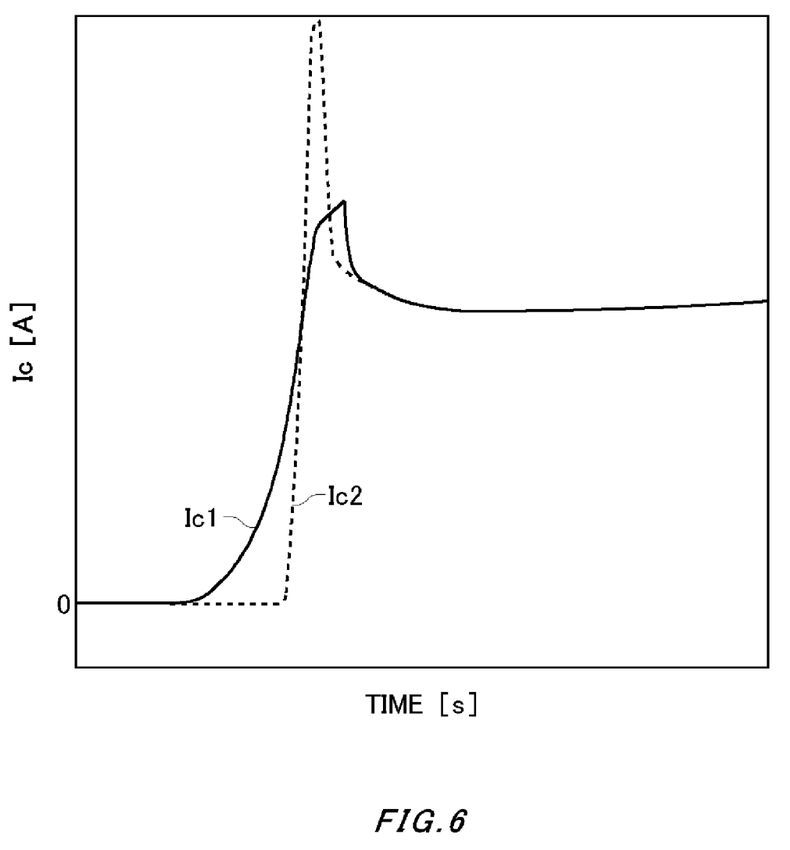
Figure 7:
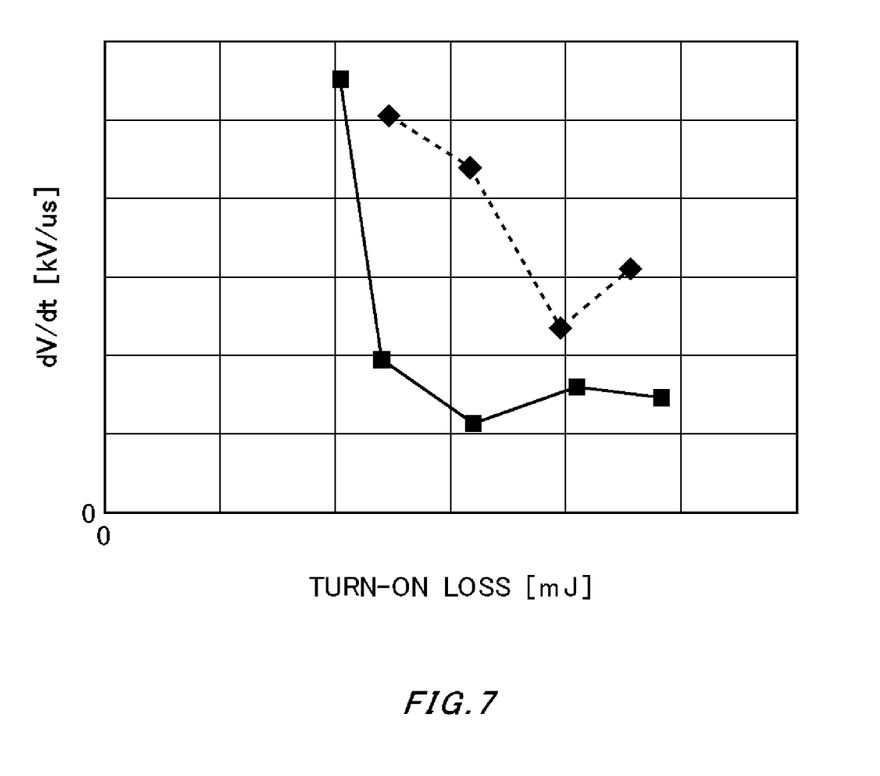
FIG. 7 is a graph showing relationship between dVak/dt of a FWD and turn-on loss (Eon) of an IGBT in the semiconductor device 100 and in a comparative example.

FIG. 6 is a graph showing an exemplary waveform of collector current Ic1 observed when the semiconductor device 100 is turned on. FIG. 7 also shows a waveform of collector current Ic 2 in a comparative example. In the comparative example, the second electrical element 82 in the semiconductor device 100 is replaced by the first electrical element 81, and the emitter region 12 and the base region 14 are provided adjacent also to the second gate trench portion 40.

In the semiconductor device 100, more holes are accumulated in the vicinity of the second gate trench portion 40, and fewer holes are accumulated in the vicinity of the first gate trench portion 30. Because the holes accumulated in the vicinity of the first gate trench portion 30 adjacent to the emitter region 12 influence fluctuation of collector current Ic, jump of the collector current Ic in the semiconductor device 100 can be suppressed when the semiconductor device 100 is turned on.

FIG. 7 is a graph showing the relationship between dVak/dt of a FWD and turn-on loss (Eon) of an IGBT in the semiconductor device 100 and in a comparative example. FIG. 7 shows the characteristic of the semiconductor device 100 in a solid line and the characteristic of the comparative example in a dotted line. In the present example, the resistance value of the first electrical element 81 was set to 3.5Ω, and the resistance value of the second electrical element 82 was set to 100Ω in the semiconductor device 100. The gate resistance of the comparative example was set to 3.5Ω.

As shown in FIG. 7, the trade-off between dVak/dt and Eon was improved by setting the resistance value of the second electrical element 82 greater than the resistance value of the first electrical element 81.

Figure 8:
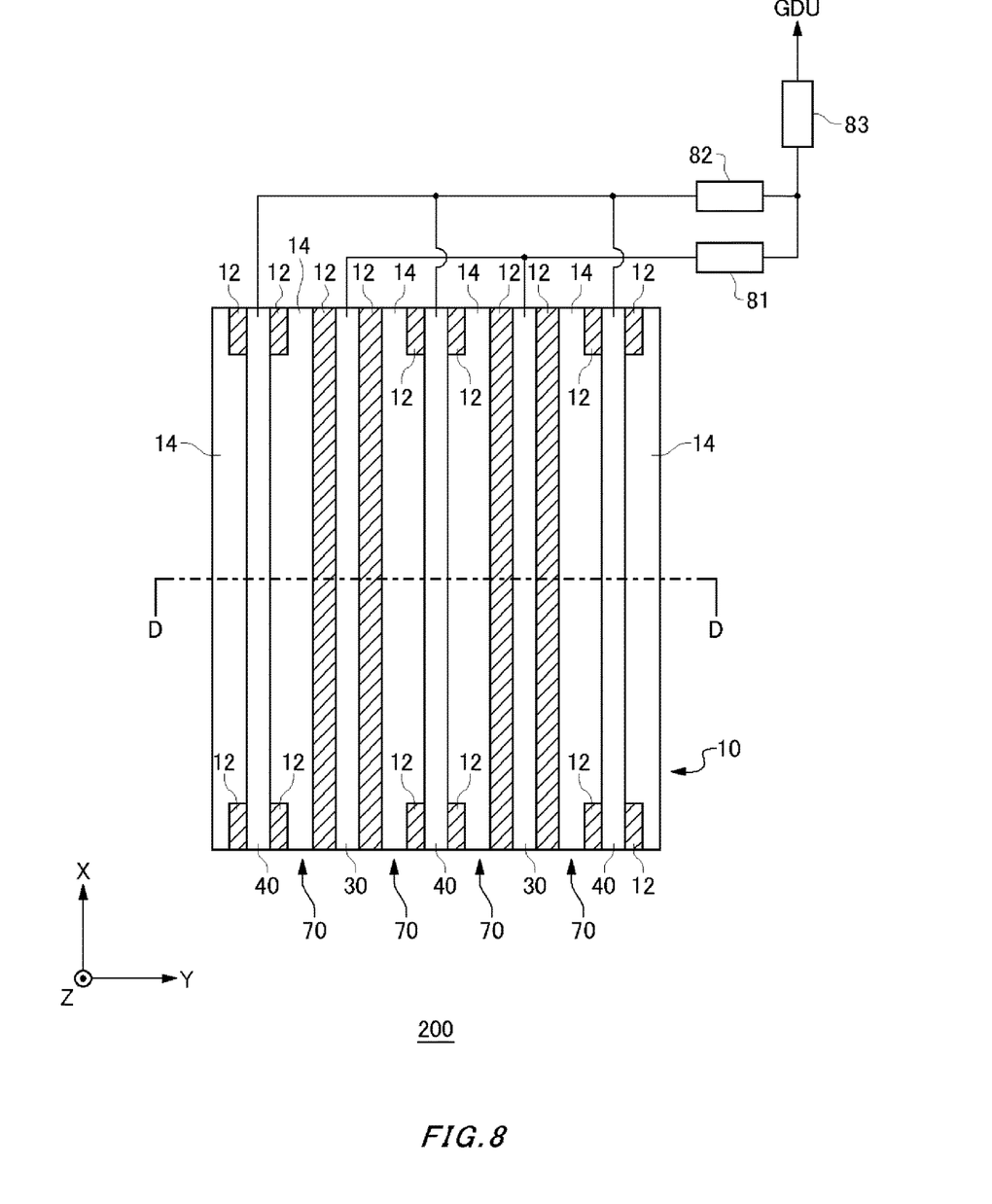
FIG. 8 is a top view showing an exemplary semiconductor device 200 according to another embodiment.
Figure 9:
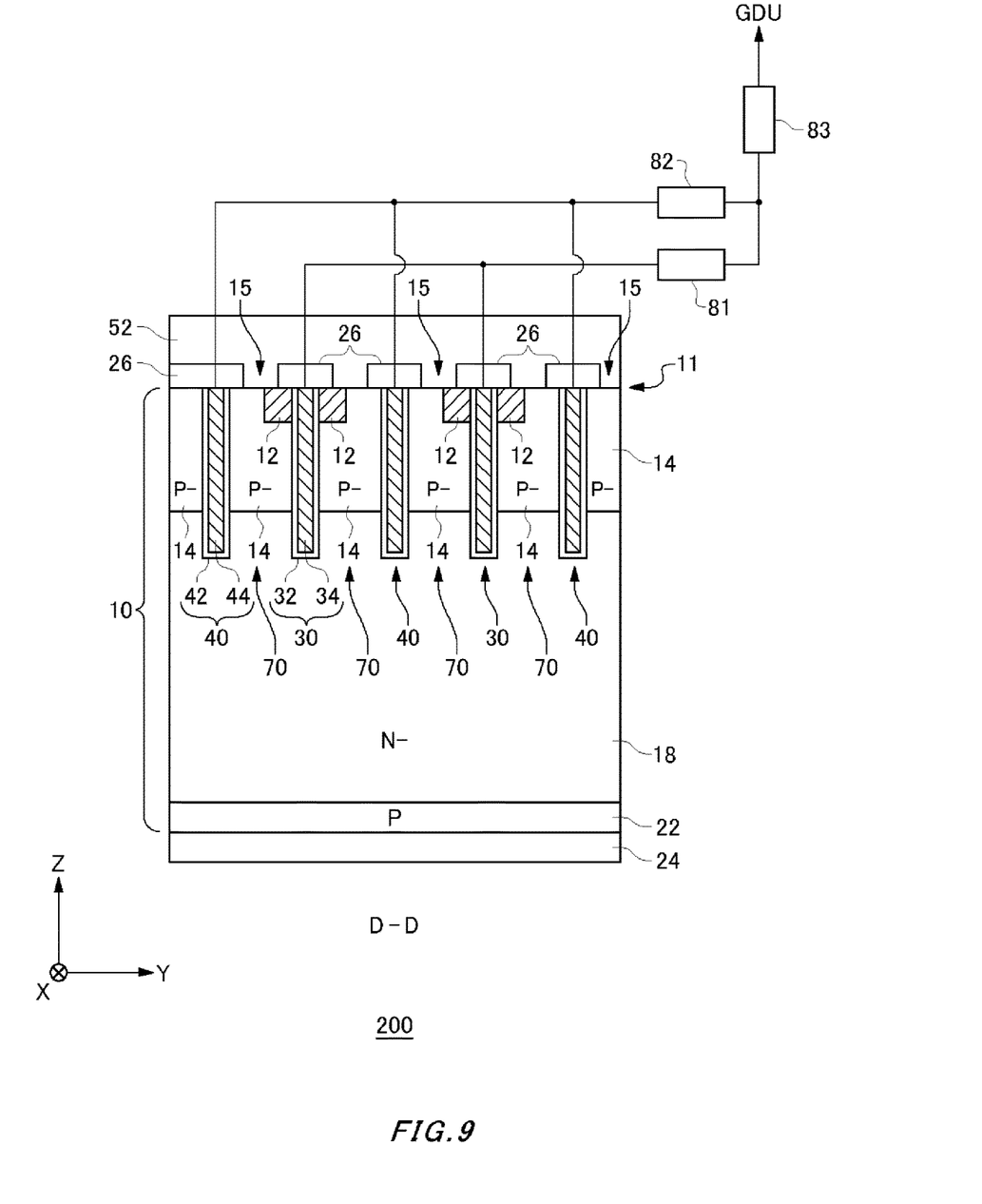
FIG. 9 is a diagram showing a cross section taken along D-D in FIG. 8.

FIG. 8 is a top view showing an exemplary semiconductor device 200 according to another embodiment. FIG. 9 is a diagram showing a cross section taken along D-D in FIG. 8. Arrangement of the emitter region 12, the base region 14 and the drift region 18 in the semiconductor device 200 is different from the arrangement in the semiconductor device 100. The remaining structure may be the same as that of the semiconductor device 100.

In the semiconductor device 200, the emitter region 12 is in contact with both the first gate trench portion 30 and the second gate trench portion 40. However, on the upper surface of the semiconductor substrate 10, the area of the emitter region 12 provided in contact with the first gate trench portion 30 is larger than the area of the emitter region 12 provided in contact with the second gate trench portion 40. Also in such a configuration, the trade-off between dVak/dt and Eon can be improved by connecting the second electrical element 82, with which the time constant of the RC circuit is relatively increased, to the second gate trench portion 40, with which influence on the collector current Ic is relatively small.

For example, as shown in FIG. 8, the emitter region 12 is continuously provided in a stripe pattern in a region of each mesa portion 70, the region adjacent to the first gate trench portion 30. On the other hand, the emitter region 12 is discretely provided in a region of each mesa portion 70, the region adjacent to the second gate trench portion 40. The total area of the emitter regions 12 adjacent to the second gate trench portions 40 may be equal to or smaller than half, or equal to or smaller than one tenth of the total area of the emitter regions 12 adjacent to the first gate trench portions 30.

As shown in FIG. 8 and FIG. 9, the base region 14 may be formed in the upper surface of each mesa portion 70. The drift region 18 of the present example is not exposed on the upper surface of the semiconductor substrate 10.

Note that in the semiconductor device 100 and the semiconductor device 200, the IGBT and the FWD may also be formed on the same semiconductor substrate 10. The FWD has a dummy trench portion to which an emitter potential is applied. The base region 14 is formed in the upper surface of the mesa portion 70 sandwiched between the dummy trench portions.

Figure 10:
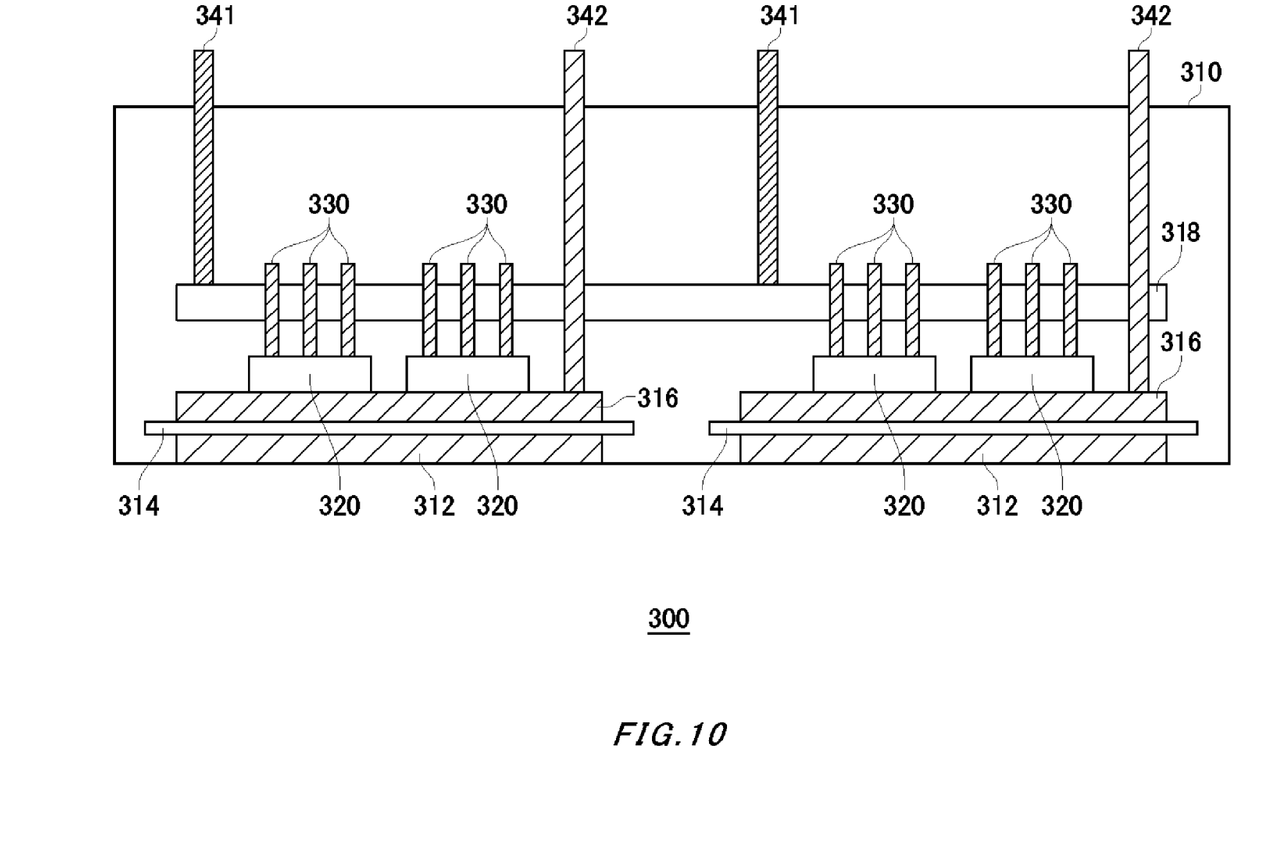
FIG. 10 is a cross-sectional view showing an exemplary semiconductor device 300 according to another embodiment.

FIG. 10 is a cross-sectional view showing an exemplary semiconductor device 300 according to another embodiment. The semiconductor device 300 of the present example is a semiconductor module. The semiconductor device 300 may be a semiconductor module for power conversion. The semiconductor device 300 can be used in inverter devices, uninterruptible power supply devices, power conditioners, vehicles such as railway vehicles, machine tools, industrial robots, and the like, but the usage of the semiconductor device 300 is not limited to the above.

The semiconductor device 300 is equipped with one or more semiconductor chips 320. The semiconductor device 300 shown in FIG. 10 is equipped with a plurality of semiconductor chips 320. Each semiconductor chip 320 may have the same structure as that of the semiconductor device 100 or that of the semiconductor device 200 shown in FIG. 1 through FIG. 9. The semiconductor device 300 may be equipped with an upper arm portion and a lower arm portion of an inverter circuit. The plurality of semiconductor chips 320 may be included in each arm portion.

Each semiconductor chip 320 is accommodated in a package portion 310 formed of insulating material such as resin. The package portion 310 is sealed such that the semiconductor chips 320 are not exposed.

The semiconductor chip 320 is arranged on a plate-like upper base portion 316 formed of conductive material such as copper. The upper base portion 316 may be electrically connected to any one of terminals of the semiconductor chip 320. The upper base portion 316 of the present example is connected to the collector electrode 24 of the semiconductor chip 320. The main external connection pin 342 is connected to the upper base portion 316. An end of the main external connection pin 342, the end opposite to the upper base portion 316, is exposed to the outside of the package portion 310.

The upper base portion 316 is arranged on the plate-like lower base portion 312 with the insulating substrate 314 interposed therebetween. The upper base portion 316, the insulating substrate 314, and the lower base portion 312 are accommodated in the package portion 310. However, the lower surface of the lower base portion 312 may be exposed on the lower surface of the package portion 310 in order to improve heat release efficiency.

The semiconductor device 300 includes a wiring substrate 318 accommodated in the package portion 310 and arranged to face the semiconductor chip 320. The wiring substrate 318 is, for example, a printed circuit board. In the wiring substrate 318, wiring is formed to electrically connect a circuit provided outside the semiconductor device 300 and the terminals of the semiconductor chip 320. The wiring substrate 318 may include wiring connected to the first gate trench portion 30 and wiring connected to the second gate trench portion 40.

A control external connection pin 341 is connected to the wiring substrate 318 of the present example. The control external connection pin 341 is connected to the gate pad 94 of the semiconductor chip 320 via the wiring substrate 318. An end of the control external connection pin 341, the end opposite to the wiring substrate 318, is exposed to the outside of the package portion 310.

Note that FIG. 10 shows the control external connection pins 341 and the main external connection pins 342, but the semiconductor device 300 may have more external connection pins than shown in FIG. 10. For example, the semiconductor device 300 may also have the main external connection pin 342, one end of which is connected to the wiring substrate 318 and the other end of which is exposed to the outside of the package portion 310. The main external connection pin 342 is connected to a main terminal of the semiconductor chip 320 via the wiring substrate 318.

The semiconductor device 300 includes a plurality of internal connection pins 330 accommodated in the package portion 310. The internal connection pins 330 are provided between the semiconductor chip 320 and the wiring substrate 318 and electrically connect the terminals of the semiconductor chip 320 and the wiring in the wiring substrate 318. The plurality of internal connection pins 330 include a pin connected to the emitter electrode 52 of the semiconductor chip 320 and a pin connected to the gate pad 94 of the semiconductor chip 320.

Note that the first electrical element 81 and the second electrical element 82 are provided in the semiconductor chip in the example shown in FIG. 3 through FIG. 5. In another example, the first electrical element 81 and the second electrical element 82 may be provided in the wiring substrate 318. In this case, various first electrical elements 81 and second electrical elements 82 can be provided, which makes it possible to easily adjust the time constant of the RC circuit constituted by the first electrical element 81 and the first gate trench portion 40 and that of the RC circuit constituted by the second electrical element 82 and the second gate trench portion 40. The resistance or the capacitance of the internal connection pin 330 connected to the first gate trench portion 30 and that of the internal connection pin 330 connected to the second gate trench portion 40 may be different from each other. In this case, the internal connection pin 330 functions as at least part of the first electrical element 81 and the second electrical element 82.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
   a semiconductor substrate having a drift region of a first conductivity type;
   a base region of a second conductivity type formed between an upper surface of the semiconductor substrate and the drift region in the semiconductor substrate;
   an emitter region of the first conductivity type provided between the upper surface of the semiconductor substrate and the base region in the semiconductor substrate;
   a first gate trench portion that is formed in the upper surface of the semiconductor substrate and is in contact with the emitter region and the base region, and has a first gate conductive portion to which a first gate voltage is applied;
   a second gate trench portion formed in the upper surface of the semiconductor substrate, and has a second gate conductive portion to which a second gate voltage is applied;
   a first electrical element electrically connected to the first gate trench portion; and
   a second electrical element electrically connected to the second gate trench portion,
   wherein a time constant of an RC circuit constituted by the second electrical element and the second gate trench portion is greater than a time constant of an RC circuit constituted by the first electrical element and the first gate trench portion.

2. The semiconductor device according to claim 1, wherein, on the upper surface of the semiconductor substrate, an area of the emitter region provided in contact with the first gate trench portion is larger than an area of the emitter region provided in contact with the second gate trench portion.

3. The semiconductor device according to claim 1, wherein the second gate trench portion is not in contact with the emitter region.

4. The semiconductor device according to claim 1, wherein the first electrical element has a first resistor, and the second electrical element has a second resistor, a resistance value of which is greater than that of the first resistor.

5. The semiconductor device according to claim 1, further comprising:
 a gate pad formed above the semiconductor substrate;
 a first electrical path that is formed above the semiconductor substrate and electrically connects the gate pad and the first gate trench portion; and
 a second electrical path that is formed above the semiconductor substrate and electrically connects the gate pad and the second gate trench portion,
 wherein the first electrical element is provided in the first electrical path, and the second electrical element is provided in the second electrical path.

6. The semiconductor device according to claim 1, further comprising:
 a package portion accommodating the semiconductor substrate; and
 a wiring substrate that is accommodated in the package portion and provided with wiring electrically connecting the first gate trench portion and the second gate trench portion,
 wherein the first electrical element and the second electrical element are provided in the wiring substrate.

7. The semiconductor device according to claim 1, wherein
 the first electrical element and the second electrical element are connected to a gate driver unit via a common resister.

8. The semiconductor device according to claim 4, wherein
 a trench capacitance of the first gate trench portion is substantially the same as a trench capacitance of the second gate trench portion.

9. The semiconductor device according to claim 1, wherein,
 a linear portion of the first gate trench portion and a linear portion of the second gate trench portions are alternately arranged one by one, as viewed from the upper surface of the semiconductor substrate.

* * * * *